United States Patent
Cheon

(10) Patent No.: US 10,128,459 B2
(45) Date of Patent: Nov. 13, 2018

(54) DISPLAY DEVICE

(71) Applicant: SAMSUNG DISPLAY CO., LTD., Yongin-si, Gyeonggi-do (KR)

(72) Inventor: Kyuhyeong Cheon, Seongnam-si (KR)

(73) Assignee: Samsung Display Co., Ltd., Yongin-si (KR)

(*) Notice: Subject to any disclaimer, the term of this patent is extended or adjusted under 35 U.S.C. 154(b) by 338 days.

(21) Appl. No.: 14/981,362

(22) Filed: Dec. 28, 2015

(65) Prior Publication Data

US 2016/0278201 A1  Sep. 22, 2016

(30) Foreign Application Priority Data

Mar. 18, 2015 (KR) .................. 10-2005-0037327

(51) Int. Cl.
| | | |
|---|---|---|
| H05K 1/14 | (2006.01) | |
| H01L 51/52 | (2006.01) | |
| G02F 1/1333 | (2006.01) | |
| H01L 27/32 | (2006.01) | |

(52) U.S. Cl.
CPC ...... *H01L 51/524* (2013.01); *G02F 1/133308* (2013.01); *H01L 27/3272* (2013.01); *H01L 27/3297* (2013.01); *G02F 2001/133331* (2013.01); *H01L 51/5271* (2013.01); *H05K 1/147* (2013.01); *H05K 2201/10128* (2013.01)

(58) Field of Classification Search
CPC .............. H01L 51/524; H01L 27/3297; H01L 27/3272; H01L 51/5271; G02F 1/133308; H05K 1/147
See application file for complete search history.

(56) References Cited

U.S. PATENT DOCUMENTS

| | | | | |
|---|---|---|---|---|
| 9,844,898 | B2* | 12/2017 | Hill | ....................... B29C 45/0053 |
| 2010/0277684 | A1* | 11/2010 | Fukushima | ......... H01L 51/5246 |
| | | | | 349/158 |
| 2012/0026107 | A1* | 2/2012 | Kim | ....................... G06F 3/044 |
| | | | | 345/173 |
| 2012/0162106 | A1* | 6/2012 | Choi | ..................... G06F 1/1626 |
| | | | | 345/173 |
| 2014/0071550 | A1 | 3/2014 | Lee | |
| 2015/0042902 | A1* | 2/2015 | Enomoto | .......... G02F 1/133615 |
| | | | | 349/12 |
| 2015/0124382 | A1* | 5/2015 | Taniguchi | ......... G02F 1/133308 |
| | | | | 361/679.01 |

(Continued)

FOREIGN PATENT DOCUMENTS

| | | |
|---|---|---|
| KR | 10-2008-0074005 A | 8/2008 |
| KR | 10-2012-0006175 A | 1/2012 |
| KR | 10-2014-0035201 A | 3/2014 |

(Continued)

*Primary Examiner* — Nathan Milakovich
(74) *Attorney, Agent, or Firm* — Lewis Roca Rothgerber Christie LLP

(57) ABSTRACT

A display device includes: a display panel including a display area and a pad area; a window disposed opposite to the display panel and covering the display area and the pad area; a printed layer located on a portion of the window overlapping the pad area; an adhesive layer located between the window and the display panel and covering at least a portion of an upper surface of the printed layer; and a reflection layer located between the printed layer and the adhesive layer.

16 Claims, 5 Drawing Sheets

(56) References Cited

U.S. PATENT DOCUMENTS

2016/0139310 A1* 5/2016 Lee ..................... G02B 5/0825
                                                          359/584
2017/0227705 A1* 8/2017 Araki .................. G02B 6/0043

FOREIGN PATENT DOCUMENTS

KR    10-2014-0094203 A    7/2014
KR    10-2014-0096670 A    8/2014

* cited by examiner

DISPLAY DEVICE

CROSS-REFERENCE TO RELATED APPLICATION

This application claims priority to and the benefit of Korean Patent Application No. 10-2015-0037327, filed on Mar. 18, 2015, in the Korean Intellectual Property Office, the entire disclosure of which is incorporated herein by reference.

BACKGROUND

1. Field

Embodiments of the present invention relate to a display device.

2. Description of the Related Art

In general, flat panel display ("FPD") devices, such as liquid crystal display ("LCD") devices or organic light emitting diode ("OLED") display devices, include a plurality of pairs of electric field generating electrodes and electro-optical active layers interposed therebetween. An LCD device includes a liquid crystal layer as an electro-optical active layer, and an OLED display device includes an organic light emitting layer as an electro-optical active layer.

A display device includes a display panel generating an image and displaying the generated image and a window on the display panel to protect the display panel. The window is attached on the display panel. The image generated in the display panel passes through the window to be displayed to an observer. The window may include a printed layer designed to have various colors. The printed layer contacts an adhesive layer through which the window and the display panel are adhered to one another.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to a display device capable of preventing a non-cured state of an adhesive layer located on a printed layer.

According to an exemplary embodiment of the present invention, a display device includes: a display panel including a display area and a pad area; a window disposed opposite to the display panel and covering the display area and the pad area; a printed layer located on a portion of the window overlapping the pad area; an adhesive layer located between the window and the display panel and covering at least a portion of an upper surface of the printed layer; and a reflection layer located between the printed layer and the adhesive layer.

The reflection layer may include at least one of a mirror silver ink, a pearlescent pigment, and an aluminum paste.

The display device may further include a barrier tape located between the printed layer and the reflection layer.

The display device may further include a flexible printed circuit board (FPCB) connected to the pad area to provide an electric signal to the display panel.

At least a portion of the flexible printed circuit board may overlap the printed layer and the adhesive layer.

At least a portion of the reflection layer may overlap the flexible printed circuit board.

The printed layer may include a design layer.

The may overlap printed layer may include a light shielding layer.

According to another exemplary embodiment of the present invention, a display device includes: a display panel including a display area and a pad area; a window disposed opposite to the display panel and covering the display area and the pad area; a printed layer located on a portion of the window overlapping the pad area; a reflection layer located on the printed layer; and an adhesive layer located between the window and the display panel and covering at least a portion of an upper surface of the reflection layer.

The reflection layer may include at least one of a mirror silver ink, a pearlescent pigment, and an aluminum paste.

The display device may further include a barrier tape located between the printed layer and the reflection layer.

The display device may further include an FPCB connected to the pad area to provide an electric signal to the display panel.

At least a portion of the flexible printed circuit board may overlap the printed layer and the adhesive layer.

At least a portion of the reflection layer may overlap the flexible printed circuit board.

The printed layer may include a design layer.

The printed layer may include a light shielding layer.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
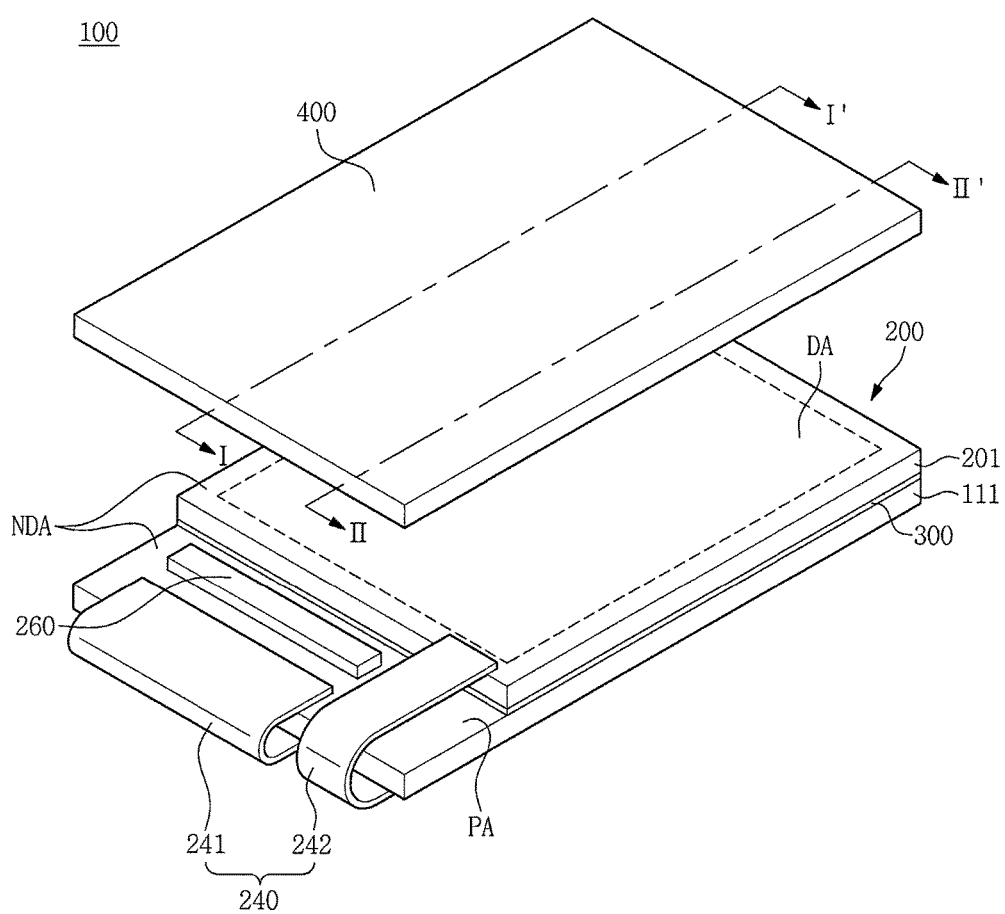
FIG. 1 is a perspective view schematically illustrating an organic light emitting diode (OLED) display device according to a first exemplary embodiment.

Features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

All terminologies used herein are merely used to describe exemplary embodiments and may be modified according to the relevant art and the intention of an applicant. Therefore, the terms used herein should be interpreted as having a meaning that is consistent with their meanings in the context of the present disclosure, and is not intended to limit the exemplary embodiments. Throughout the specification, when an element is referred to as being "connected" to another element, the element is "directly connected" to the other element, or "electrically connected" to the other element with one or more intervening elements interposed therebetween. As used herein, the singular forms "a," "an," and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

In addition, although the accompanying drawings illustrate an active matrix organic light emitting diode ("AMO-LED") display device having a 2Tr-1 Cap structure in which a single pixel includes two thin film transistors (TFTs) and a single capacitor, the type of an organic light emitting diode ("OLED") display device according to an exemplary embodiment is not limited thereto. Accordingly, in an OLED display device according to an exemplary embodiment, the number of TFTs, capacitors, and wirings is not limited. As used herein, the term "pixel" refers to a minimum unit for displaying an image, and an OLED display device may display an image through a plurality of pixels.

Hereinafter, exemplary embodiments of a display device will be explained with respect to an OLED display device including an organic light emitting layer. However, the display device is not limited thereto, and features of the invention may also be applied to a liquid crystal display ("LCD") device, a plasma display panel ("PDP") device, or a field emission display ("FED") device.

An OLED display device 100 according to a first exemplary embodiment will be described with reference to FIGS. 1 through 6 hereinbelow.

Figure 2:
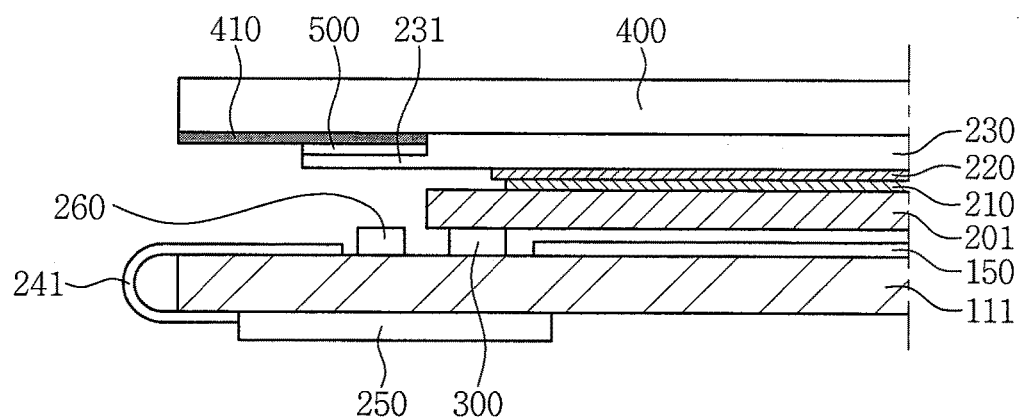
FIG. 2 is a cross-sectional view taken along line I-I' of FIG. 1.
Figure 3:
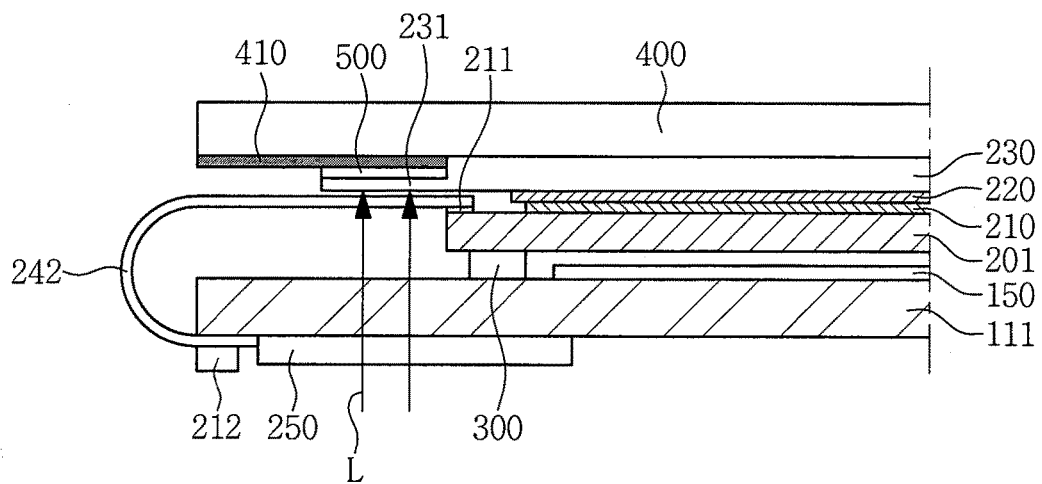
FIG. 3 is a cross-sectional view taken along line II-II' of FIG. 1.
Figure 4:
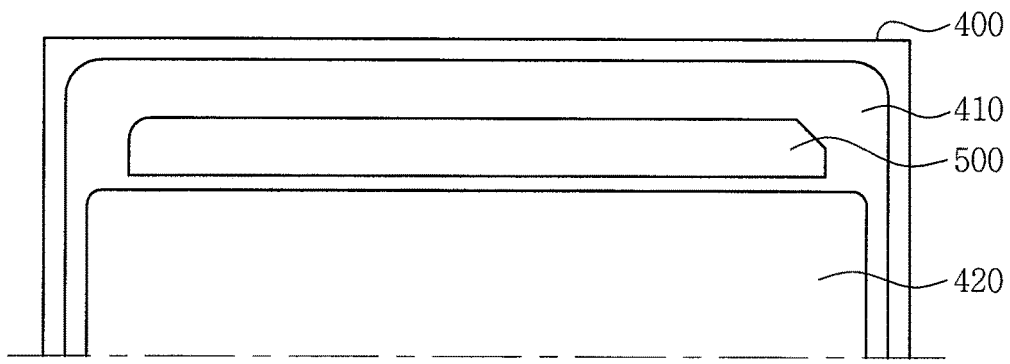
FIG. 4 is a plan view schematically illustrating a reflection layer of FIG. 1.

FIG. 1 is a perspective view schematically illustrating an OLED display device according to a first exemplary embodiment; FIG. 2 is a cross-sectional view taken along line I-I' of FIG. 1; FIG. 3 is a cross-sectional view taken along line II-II' of FIG. 1; and FIG. 4 is a plan view schematically illustrating a reflection layer of FIG. 1.

Referring to FIGS. 1 through 4, the OLED display device 100 according to the first exemplary embodiment may include a display panel 200, a touch driver chip 212, an adhesive layer 230, a flexible printed circuit board (FPCB) 240, a printed circuit board (PCB) 250, a driver chip 260, a sealant 300, a window 400, a printed layer 410, and a reflection layer 500.

The display panel 200, which displays an image, may include one of the following panels: an LCD panel, an electrophoretic display ("EPD") panel, an OLED display panel, a light emitting diode ("LED") display panel, an inorganic electroluminescent ("EL") display panel, an FED panel, a surface-conduction electron-emitter display ("SED") panel, a PDP, and a cathode ray tube ("CRT") display panel. However, the aforementioned types of the display panel are only given by way of example, and all types thereof including those commercialized and currently available or those to be further developed in accordance with advances in technology may be used as the display panel 200 according to an exemplary embodiment.

The display panel 200 may include a first substrate 111, a second substrate 201 disposed opposite to the first substrate 111, a display unit 150, the sealant 300, a touch unit 210, a touch pad unit 211, and a polarizer 220. However, the configuration of the display panel 200 is not limited thereto. Accordingly, the first substrate 111 may also be sealed by a sealing film, or the like, other than the second substrate 201.

The first substrate 111 may include a display area DA in which an image is displayed by light emission and a non-display area NDA disposed along an edge portion of the display area DA. The display area DA of the first substrate 111 may include a plurality of pixels formed therein to display images. The display unit 150 may be disposed in the display area DA.

The non-display area NDA may include a pad area PA in which a plurality of pad electrodes are formed. The pad electrodes may receive an external signal supplied thereto which allows an OLED element to emit light to transmit the external signal to the OLED element. The pad area PD may include at least a driver chip 260 formed thereon.

The first substrate 111 may be formed of a transparent glass material mainly composed of silicon oxide ($SiO_2$). However, the material forming the first substrate 111 is not necessarily limited thereto, and the first substrate 111 may be formed of a transparent plastic material.

The display unit 150 may be formed on the first substrate 111, and may be connected to the driver chip 260. The display unit 150 may include an OLED element, a thin film transistor (TFT) for driving the OLED element, a wiring, and the like. A description pertaining to the display unit 150 will be provided further below with reference to FIGS. 5 and 6. Aside from the OLED element, any element able to configure the display device may be included in the display unit 150.

The second substrate 201 may be disposed opposite to the first substrate 111, and may be laminated onto the first substrate 111 while having the sealant 300 therebetween. The second substrate 201 may cover and protect the display unit 150. The second substrate 201 may use a glass substrate or a transparent synthetic resin film such as an acrylic resin, and may also use a metal substrate. For example, the second substrate 201 may be formed using one of the following materials: a polyethylene (PE) film, a polypropylene (PP) film, a polyamide (PA) film, a polyacetal, also known as polyoxymethylene (POM), film, a poly(methyl methacrylate) (PMMA) film, a polybutylene terephthalate (PBT) film, a polycarbonate (PC) film, a cellulose film, and a moisture-proof cellophane.

The second substrate 201 may have an area smaller than the first substrate 111. Accordingly, the pad area PA of the first substrate 111 may be exposed through the second substrate 201.

The sealant 300 may use a commonly used material such as a sealing glass frit.

The touch unit 210 may be located on the second substrate 201, corresponding to the display area DA of the first substrate 111. The touch unit 210 may include first and second electrodes intersecting one another. The first and second electrodes may be patterned, directly on the second substrate 201, in an on-cell type manner in which a plurality of columns of the electrodes are included. The first and second electrodes may correspond to a touch sensor pattern. In addition, the touch unit 210 may be located on the second substrate 201, as a separately prepared touch panel. The touch unit 210 may include the touch pad unit 211 on the second substrate 201. The touch driver chip 212 may control driving of the touch unit 210, and may be formed on a second FPCB 242. The touch driver chip 212 may be an integrated circuit (IC) chip.

The touch unit 210 may recognize a touch input from a touch unit such as a pen or a finger of a user to thereby transmit a signal corresponding to a position at which the touch input is performed. The touch unit 210 may be used as an input unit with respect to the OLED display device 100, and may be configured in a resistive or capacitive manner.

The polarizer 220 may be located between the window 400 and the touch unit 210. The polarizer 200 may prevent reflection of external light.

The driver chip 260 may include a scan driver and a data driver for driving pixels. In addition, the first substrate 111 may further include pad electrodes disposed in the pad area PA. The driver chip 260 may be mounted on the pad area PA of the first substrate 111 in a chip-on-glass (COG) manner to thereby be electrically connected to the pad electrode (not illustrated). The driver chip 260 may generate a scan signal and a data signal, corresponding to electric signals transmitted via the FPCB 240. The scan signal and the data signal may be provided to a gate line and a data line of the display area DA through the pad electrodes.

In one embodiment, the driver chip 260 may not be necessarily formed in the non-display area NDA, and may be omitted. In addition, the driver chip 260 may be mounted on the FPCB 240 in a chip-on-film (COF) manner. In other words, a tape-carrier-package (TCP) in which the driver chip 260 is mounted on a film in a chip form may be applied to the OLED display device 100. The driver chip 260 may be an IC chip such as a driver IC chip.

The FPCB 240 may be connected to the pad area PA to supply an electric signal to the display panel 200, and may be bent along a side surface of the display panel 200. The FPCB 240 may include a first FPCB 241 and the second FPCB 242.

The first FPCB 241 may supply an electric signal to the display panel 200. For example, the first FPCB 241 may be connected to the pad area PA of the display panel 200 to thereby transmit an electric signal to the driver chip 260. In one embodiment, such an electric signal may include one or more of the following signals: a power signal, a driving signal, a control signal, and a data signal.

The first FPCB 241 may be located on an upper surface of the first substrate 111 in the pad area PA, and may be bent along a side surface of the first substrate 111. In other words, the first FPCB 241 may be located on the upper surface of the first substrate 111, and may be located on a lower surface of the first substrate 111 by being bent.

The second FPCB 242 may be connected to the touch pad unit 211 formed on the second substrate 201 to be connected to the touch unit 210, and may include the touch driver chip 212. In detail, the second FPCB 242 may be connected to the touch pad unit 211 of the second substrate 201 in a COF manner.

The second FPCB 242 may be located on an upper surface of the second substrate 201 to be connected to the touch unit 210, and may be bent along the side surface of the first substrate 111 and a side surface of the second substrate 201. In other words, the second FPCB 242 may be located on the upper surface of the second substrate 201, and may be located on the lower surface of the first substrate 111 by being bent.

In general, the display panel 200 displays an image on an upper surface of the display panel 200, and thus, a lower surface of the display panel 200 is an area unseen by a user. Accordingly, the first FPCB 241 and the second FPCB 242 may be located on the lower surface of the display panel 200 in order to significantly increase the spatial efficiency of the display panel 200 and hide an element unnecessary to be seen by a user. However, the disposition of the first FPCB 241 and the second FPCB 242 is only given by way of example, and the first FPCB 241 and the second FPCB 242 may be located on a side surface of the display panel 200 as necessary.

The PCB 250 may be a circuit board that applies a driving signal to the display panel 200. The PCB 250 may include a timing controller that generates a control signal for driving the display panel 200, a power voltage generator that generates a power voltage, and the like.

The PCB 250 may be located on a surface of the display panel 200. More particularly, the PCB 250 may be located on a lower surface of the display panel 200. In general, since the display panel 200 displays an image on the upper surface of the display panel 200, the lower surface of the display panel 200 may be an area unseen by a user. Accordingly, the PCB 250 may be located on the lower surface of the display panel 200 in order to significantly increase the spatial efficiency thereof and hide an element unnecessary to be seen by a user. However, the disposition of the PCB 250 is only given by way of example, and the PCB 250 may be located on the side surface of the display panel 200 as necessary.

The PCB 250 may include electronic elements generating an electric signal that is transmitted to the driver chip 260 and the touch driver chip 212. The first FPCB 241 and the second FPCB 242 may not self-sufficiently generate an electric signal, and may connect the display panel 200 and the PCB 250. In other words, the first FPCB 241 may connect the PCB 250 and the driver chip 260 of the first substrate 111, and the second FPCB 242 may connect the PCB 250 and the touch unit 210. The FPCB 240 may electrically connect the display panel 200 and the PCB 250.

The window 400 may be located opposite to the display panel 200, and may cover the display area DA and the pad area PA. The window 400 may be formed of a transparent material such as glass or a resin, and may serve to protect the display panel 200 against external impacts applied thereto so as not to damage the display panel 200. For example, the window 400 may be located on the touch unit 210, and may cover the display area DA and the pad area PA. The window 400 may be adhered to the second substrate 201 via the adhesive layer 230 therebetween. The window 400 may be larger than the display panel 200 in size. However, the size of the window 400 is not limited thereto, and the window 400 may be substantially the same as the display panel 200 in size.

The printed layer 410 may be located on a portion of the window 400 overlapping the pad area PA. As illustrated in FIG. 4, the printed layer 410 may surround a display area 420 of the window 400. The printed layer 410 may function as a black matrix. The printed layer 410 may include a printing material for preventing a pattern disposed below the window 400 from being seen. The printing material may include a black printing material; however, the color of the printing material may vary based on a design of a desired device. The printed layer 410 may further include a photo-absorbent material such as chromium (Cr).

The adhesive layer 230 may be located between the window 400 and the display panel 200, and may serve to enhance the luminance, transmittance, reflectivity, and visibility of the OLED display device 100. The adhesive layer 230 may serve to prevent an air gap from being formed between the window 400 and the second substrate 201, and may prevent the infiltration of undesired components such as dust. The adhesive layer 230 may be a resin. The resin may be a photo-curable resin.

In one embodiment, the adhesive layer 230 may cover at least a portion of an upper surface of the printed layer 410. As illustrated in FIG. 2, a protrusion 231 of the adhesive layer 230 may be located on the upper surface of the printed layer 410. In addition, at least a portion of the FPCB 240 may overlap the printed layer 410 and the adhesive layer 230. Accordingly, the protrusion 231 of the adhesive layer 230, covering at least the portion of the upper surface of the printed layer 410, may have insufficient ultraviolet (UV) light, which cures a resin, supplied thereto, resulting in a non-cured state of the protrusion 231.

Accordingly, in the OLED display device 100, the reflection layer 500 may be located between the printed layer 410 and the adhesive layer 230. In addition, at least a portion of the reflection layer 500 may overlap the FPCB 240. For example, the reflection layer 500 may be located between the protrusion 231 of the adhesive layer 230 and the printed layer 410. The reflection layer 500 may include at least one of a mirror silver ink, a pearlescent pigment, and an aluminum paste. The reflection layer 500 may include a highly reflective material, and thus, may reflect a UV light during a UV light irradiation process in which the adhesive layer 230 is cured, such that the UV light is re-directed to the adhesive layer 230. In this regard, the non-cured state of the adhesive layer 230 may be prevented by locating the reflection layer 500 including such a highly reflective material in an area in which the non-cured state of the adhesive layer 230 is caused.

Hereinafter, a pixel of the display unit 150 will be described with reference to FIGS. 5 and 6.

Figure 5:
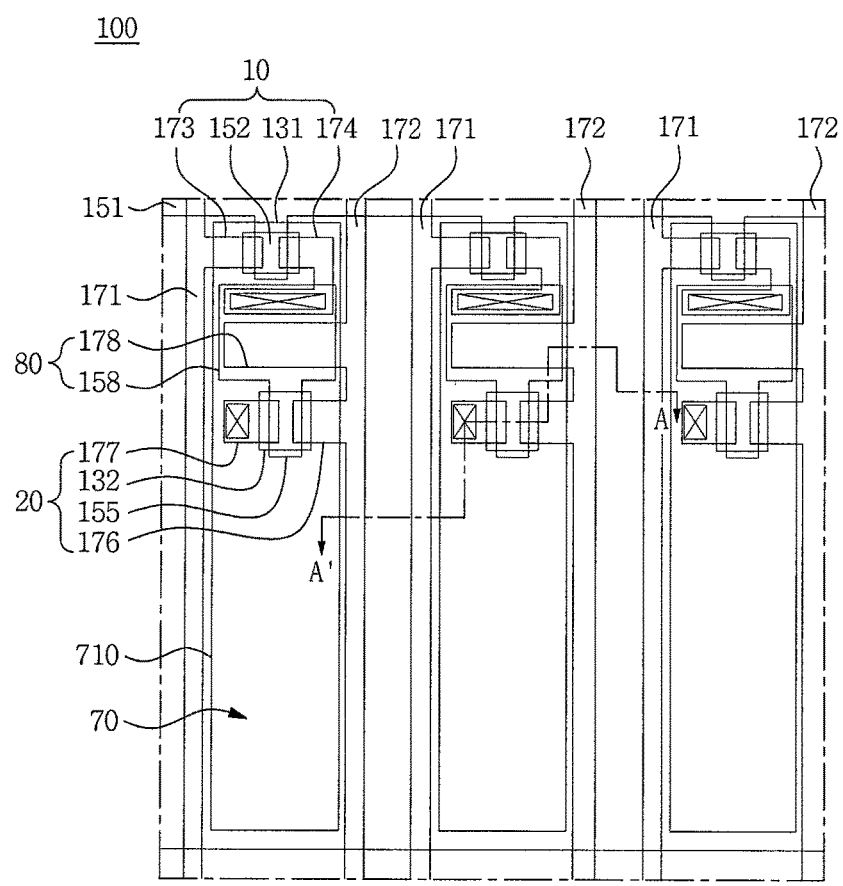
FIG. 5 is a plan view schematically illustrating a pixel of an OLED display device.
Figure 6:
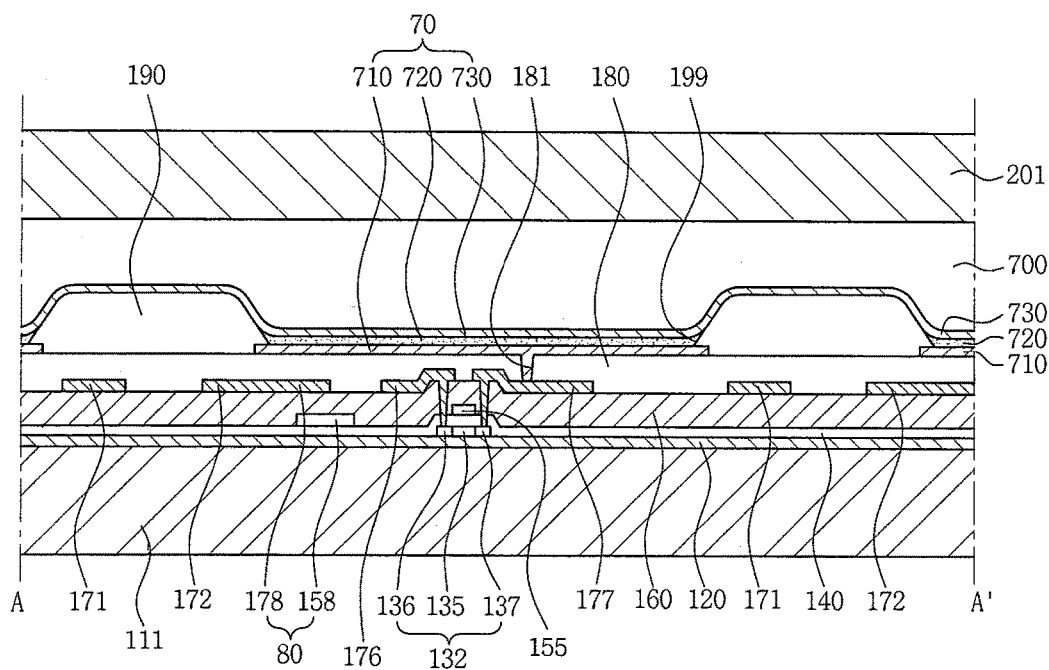
FIG. 6 is a cross-sectional view taken along line A-A' of FIG. 5.

FIG. 5 is a plan view schematically illustrating a pixel of an OLED display device; and FIG. 6 is a cross-sectional view taken along line A-A' of FIG. 5.

The display area DA according to the present exemplary embodiment will be described with reference to FIGS. 5 and 6 hereinbelow.

Referring to FIGS. 5 and 6, an AMOLED display device having a 2Tr-1Cap structure in which each pixel in the display area DA of FIG. 1 includes two TFTs, for example, a switching TFT 10 and a driving TFT 20, and a single capacitor, for example, a capacitor 80, is illustrated; however, the type of the OLED display device 100 is not limited thereto.

Accordingly, the OLED display device 100 may have various types of structure by including three or more TFTs and two or more capacitors per pixel and further including an additional wiring. As used herein, the term "pixel" refers to a minimum unit for displaying an image, and the display area may represent an image through a plurality of pixels.

The OLED display device 100 according to the first exemplary embodiment may include the first substrate 111, and the switching TFT 10, the driving TFT 20, the capacitor 80, and an OLED element 70 which are respectively formed in a plurality of pixels defined in the first substrate 111. The first substrate 111 may further include a gate line 151, and a data line 171 and a common power line 172 which intersect the gate line 151 while being insulated therefrom.

Here, each pixel may be defined by a boundary among the gate line 151, the data line 171, and the common power line 172; however, the definition of the pixel is not necessarily limited thereto.

The OLED element 70 may include a first electrode 710, an organic light emitting layer 720 formed on the first electrode 710, and a second electrode 730 formed on the organic light emitting layer 720. In one embodiment, since one or more first electrodes 710 may be formed on each pixel, the first substrate 111 may have a plurality of first electrodes 710 which are spaced from one another.

In this instance, the first electrode 710 may be an anode, a hole injection layer (HIL); and the second electrode 730 may be a cathode, an electron injection layer (EIL). However, the type of the first and second electrodes 710 and 730 is not limited thereto, and the first electrode 710 may be a cathode and the second electrode 730 may be an anode based on a driving scheme of the OLED display device 100. In addition, the first electrode 710 may be a pixel electrode and the second electrode 730 may be a common electrode.

A hole and an electron injected into the organic light emitting layer 720 are combined with one another to form an exciton. The OLED element 70 may emit light by energy generated when the exciton falls from an excited state to a ground state.

The capacitor 80 may include a pair of storage electrodes, that is, first and second storage electrodes 158 and 178, which are disposed to have an insulating layer 160 therebetween. In this instance, the insulating layer 160 may be a dielectric material. Capacitance of the capacitor 80 may be determined by an amount of electric charges accumulated in the capacitor 80 and a level of a voltage between the first and second storage electrodes 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177.

The switching TFT 10 may be used as a switching element selecting a pixel to emit light. The switching gate electrode 152 may be connected to the gate line 151. The switching source electrode 173 may be connected to the data line 171. The switching drain electrode 174 may be spaced from the switching source electrode 173 and may be connected to the first storage electrode 158.

The driving TFT 20 may apply a driving power for emitting the organic light emitting layer 720 of the OLED element 70 within the selected pixel to the first electrode 710. The driving gate electrode 155 may be connected to the first storage electrode 158 which is connected to the switching drain electrode 174. The driving source electrode 176 and the second storage electrode 178 may be connected to the common power line 172.

The driving drain electrode 177 may be connected to the first electrode 710 of the OLED element 70 through a drain contact hole 181.

Due to the configuration of the switching TFT 10 and the driving TFT 20 as described above, the switching TFT 10 may be operated by a gate voltage applied to the gate line 151 to thereby transmit a data voltage applied to the data line 171 to the driving TFT 20.

A voltage having a level substantially equal to a difference between a level of a common voltage applied from the common power line 172 to the driving TFT 20 and a level of the data voltage transmitted from the switching TFT 10 may be stored in the capacitor 80. A current having a level corresponding to the level of the voltage stored in the capacitor 80 may flow into the OLED element 70 through the driving TFT 20, and thereby the OLED element 70 may emit light.

A structure of the OLED display device 100 according to the first exemplary embodiment will be described further with reference to FIGS. 5 and 6.

Since FIG. 5 illustrates the OLED element 70, the driving TFT 20, the capacitor 80, the data line 171, and the common power line 172, a description thereof will be primarily provided. Since the stacked structure of the driving TFT 20, including the driving semiconductor layer 132, the driving gate electrode 155, the driving source electrode 176, and the driving drain electrode 177, is the same as that of the switching TFT 10, including the switching semiconductor layer 131, the switching gate electrode 152, the switching source electrode 173, and the switching drain electrode 174, a repeated description thereof will be omitted for conciseness.

In the first exemplary embodiment, the first substrate 111 may use an insulating substrate formed of glass, quartz, ceramic, plastic, or the like. However, the material forming the first substrate 111 is not limited thereto, and thus the first substrate 111 may use a metal substrate formed of stainless steel, or the like.

A buffer layer 120 may be located on the first substrate 111. The buffer layer 120 may serve to prevent the infiltration of impure elements into the first substrate 111 and planarize a surface of the first substrate 111. The buffer layer 120 may be formed of various materials capable of performing the aforementioned functions. For example, the buffer layer 120 may include one or more of the following materials: silicon nitride ($SiN_x$), silicon oxide ($SiO_2$), and silicon oxynitride ($SiO_xN_y$). However, the buffer layer 120 is not necessarily required, and thus may be omitted based on the type, the process conditions, and the like, of the first substrate 111.

The driving semiconductor layer 132 may be located on the buffer layer 120. The driving semiconductor layer 132 may be formed of one or more of the following semiconductor materials: polycrystalline silicon, amorphous silicon, and oxide semiconductor. In addition, the driving semiconductor layer 132 may include a channel region 135 undoped with impurities, and a source region 136 and a drain region 137 doped with p-type impurities at both sides of the channel region 135, respectively. In this instance, ion materials used for doping may be p-type impurities such as boron (B), and in particular, diborane ($B_2H_6$) may be used. In embodiments, such impurities may vary based on the type of the TFT.

A gate insulating layer 140 may be located on the driving semiconductor layer 132, the gate insulating layer 140 being formed of $SiN_x$, $SiO_2$, or the like. The gate insulating layer 140 may include one or more of the following materials: tetraethyl orthosilicate (TEOS), $SiN_x$, and $SiO_2$. For example, the gate insulating layer 140 may have a double-layer structure in which a $SiN_x$ layer having a thickness of about 40 nanometers (nm) and a TEOS layer having a thickness of about 80 nm are sequentially stacked. However, the gate insulating layer 140 is not limited to the aforementioned configuration described in the first exemplary embodiment.

The driving gate electrode 155, the gate line 151 of FIG. 5, and the first storage electrode 158 may be formed on the gate insulating layer 140. In this instance, the driving gate electrode 155 may overlap at least a portion of the driving semiconductor layer 132, more particularly, the channel region 135. The driving gate electrode 155 may serve to block impurities from being doped in the channel region 135 when the impurities are doped in the source region 136 and the drain region 137 of the driving semiconductor layer 132 during the formation of the driving semiconductor layer 132.

The driving gate electrode 155 and the first storage electrode 158 may be located on the same layer, and may be formed of substantially the same metal. In one embodiment, the metal forming the driving gate electrode 155 and the first storage electrode 158 may include one or more of the following materials: molybdenum (Mo), chromium (Cr), and tungsten (W). For example, the driving gate electrode 155 and the first storage electrode 158 may be formed of Mo or an alloy including Mo.

The insulating layer 160 may be located on the gate insulating layer 140, the insulating layer 160 covering the driving gate electrode 155. The insulating layer 160 may be an insulating interlayer. The insulating layer 160 may be formed of $SiN_x$, $SiO_x$, or the like, in a manner similar to that of the gate insulating layer 140. The gate insulating layer 140 and the insulating layer 160 may include respective contact holes through which the source region 136 and the drain region 137 of the driving semiconductor layer 132 are exposed.

The driving source electrode 176, the driving drain electrode 177, the data line 171, the common power line 172, and the second storage electrode 178 may be located on the insulating layer 160 in the display area DA. The driving source electrode 176 and the driving drain electrode 177 may be connected to the source region 136 and the driving region 137 of the driving semiconductor layer 132 through contact holes, respectively.

In detail, the driving source electrode 176, the driving drain electrode 177, the data line 171, the common power line 172, and the second storage electrode 178 may include a refractory metal formed of one or more of the following materials: Mo, Cr, tantalum (Ta), and titanium (Ti), or an alloy thereof, and may have a multilayer structure including the refractory metal layer and a low-resistance conductive layer. Examples of the multiplayer structure may include a double-layer structure of a Cr or Mo (or an alloy thereof) lower layer and an aluminum (Al, or an alloy thereof) upper layer, and a triple-layer structure of a Mo (or an alloy thereof) lower layer, an Al (or an alloy thereof) intermediate layer, and a Mo (or an alloy thereof) upper layer.

The driving source electrode 176, the driving drain electrode 177, the data line 171, the common power line 172, and the second storage electrode 178 may be formed of various materials other than the aforementioned materials.

Accordingly, the driving TFT 20, including the driving semiconductor layer 132, the driving gate electrode 155, the driving source electrode 176, and the driving drain electrode 177, may be formed. However, the configuration of the driving TFT 20 is not limited to the aforementioned example, and may be modified in various manners.

A protective layer 180 may be formed on the insulating layer 160, the protective layer 180 covering the driving source electrode 176, the driving drain electrode 177, and the like. The protective layer 180 may be formed of an organic material such as polyacrylate, polyimide, and the like. The protective layer 180 may be a planarization layer.

The protective layer 180 may be formed of one or more of the following materials: a polyacrylate resin, an epoxy resin, a phenolic resin, a polyamide resin, a polyimide resin, an unsaturated polyester resin, a polyphenylenether resin, a polyphenylenesulfide resin, and benzocyclobutene (BCB).

The protective layer 180 may include the drain contact hole 181 through which the driving drain electrode 177 is exposed.

The first electrode 710 may be located on the protective layer 180, and may be connected to the driving drain electrode 177 through the drain contact hole 181 of the protective layer 180.

A pixel defining layer 190 may be located on the protective layer 180 to cover the first electrode 710. The pixel defining layer 190 may include an aperture 199 through which the first electrode 710 is exposed.

In other words, the first electrode 710 may be disposed to correspond to the aperture 199 of the pixel defining layer 190. The pixel defining layer 190 may be formed of a resin such as a polyacrylate resin or a polyimide resin.

In addition, the pixel defining layer 190 may be formed of a photosensitive organic material or a photosensitive polymer material. For example, the pixel defining layer 190 may be formed using one of polyacrylate, polyimide, photosensitive polyimide (PSPI), photosensitive acryl (PA), and a photosensitive novolak resin.

The organic light emitting layer 720 may be located on the first electrode 710 within the aperture 199 of the pixel defining layer 190, and the second electrode 730 may be located on the pixel defining layer 190 and the organic light emitting layer 720.

Accordingly, the OLED element 70, including the first electrode 710, the organic light emitting layer 720, and the second electrode 730, may be formed.

One of the first electrode 710 and the second electrode 730 may be formed using a transparent conductive material, and the other thereof may be formed using a transflective conductive material or a reflective conductive material. The OLED display device 100 may be determined to be a top-emission-type display device, a bottom-emission-type display device, or a both-side emission-type display device based on the type of material forming the first and second electrodes 710 and 730.

For example, when the OLED display device 100 according to the first exemplary embodiment is a top-emission-type display device, the first electrode 710 may be formed of a transflective or reflective conductive material, and the second electrode 730 may be formed of a transparent conductive material.

Examples of the transparent conductive material may include one or more of the following materials: indium-tin oxide (ITO), indium-zinc oxide (IZO), zinc oxide (ZnO), and indium oxide ($In_2O_3$). Examples of the reflective conductive material may include one or more of the following materials: lithium (Li), calcium (Ca), lithium fluoride/calcium (LiF/Ca), lithium fluoride/aluminum (LiF/Al), aluminum (Al), silver (Ag), magnesium (Mg), and gold (Au).

The organic light emitting layer 720 may be formed of a low molecular weight organic material or a polymer organic material. The organic light emitting layer 720 may be formed as a multilayer including one or more of the following: a light emitting layer, a hole injection layer (HIL), a hole transporting layer (HTL), an electron transporting layer (ETL), and an electron injection layer (EIL). For example, the HIL may be located on the first electrode 710 having a positive pole, and the HTL, the light emitting layer, the ETL, and the EIL may be sequentially stacked thereon.

Although the organic light emitting layer 720 is only formed in the aperture 199 of the pixel defining layer 190 in the first exemplary embodiment, the disposition of the organic light emitting layer 720 is not limited thereto. Accordingly, at least one of the layers constituting the organic light emitting layer 720 may be disposed upwardly of the first electrode 710 and between the pixel defining layer 190 and the second electrode 730, within the aperture 199 of the pixel defining layer 190. In detail, the HIL, the HTL, the ETL, and the EIL of the organic light emitting layer 720 may be formed in a portion other than the aperture 199 through an open mask, and the light emitting layer of the organic light emitting layer 720 may be formed for each aperture 199 through a fine metal mask (FMM).

In one embodiment, in a case in which an LCD device is used as a display device according to an exemplary embodiment, the first electrode 710 may be physically and electrically connected to the driving drain electrode 177 through the drain contact hole 181, and may receive a data voltage applied thereto from the driving drain electrode 177. The first electrode 710 applied by the data voltage thereto may generate an electric field along with the second electrode 730, that is, the common electrode, to which a common voltage is applied, to thereby determine a direction of liquid crystal molecules of a liquid crystal layer between the two electrodes, that is, the first and second electrodes 710 and 730. The first and second electrodes 710 and 730 may constitute a capacitor (hereinafter, referred to as a "liquid crystal capacitor"), and may maintain a voltage applied thereto, even subsequently to the TFT being turned off.

A second substrate 201 may be sealingly attached to the first substrate 111 while having the OLED element 70 therebetween. The second substrate 201 may sealingly encapsulate the switching TFT 10, the driving TFT 20, and the OLED element 70 which are located on the first substrate 111 to protect the encapsulated elements from the external environment. In general, the second substrate 201 may use an insulating substrate formed of glass, plastic, or the like. In a case of a top-emission-type display device in which an image is displayed toward the second substrate 201, the second substrate 201 may be formed of a light transmissive material.

In one embodiment, a buffer material 700 may be located between the first substrate 111 and the second substrate 201. The buffer material 700 may protect internal elements such as the OLED element 70 against external impacts applied to the OLED display device 100. Further, the buffer material 700 may enhance the mechanical reliability of the OLED display device 100. The buffer material 700 may include one or more of the following organic sealants: such as a urethane resin, an epoxy resin, and an acrylic resin, and an inorganic sealant such as silicon. The urethane resin may use, for example, urethane acrylate. The acrylic resin may use, for example, butylacrylate, or ethylhexylacrylate.

Hereinafter, an OLED display device 100 according to a second exemplary embodiment will be described with reference to FIG. 7. A description of a configuration in the second exemplary embodiment the same as that described in the first exemplary embodiment will be omitted herein for conciseness.

Figure 7:
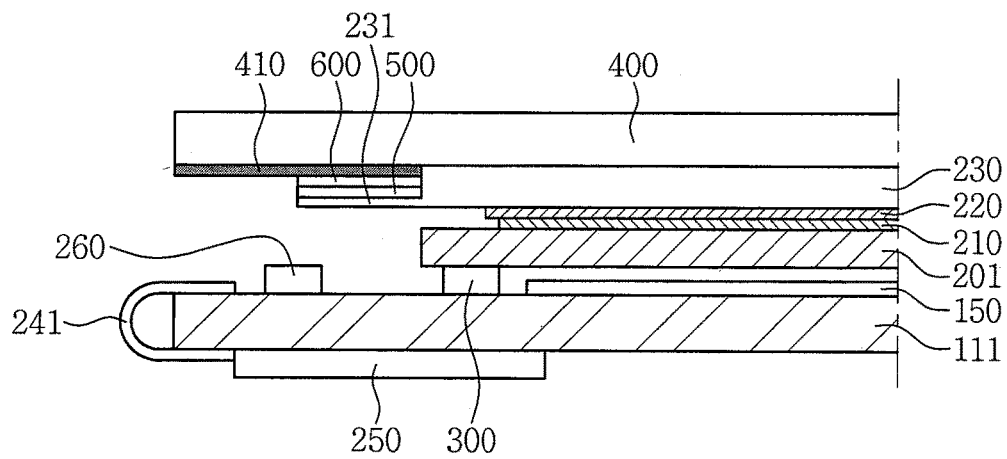
FIG. 7 is a cross-sectional view schematically illustrating an OLED display device according to a second exemplary embodiment.

FIG. 7 is a cross-sectional view schematically illustrating the OLED display device 100 according to the second exemplary embodiment.

Referring to FIG. 7, the OLED display device 100 according to the second exemplary embodiment may further include a barrier tape 600 located between the printed layer 410 and the reflection layer 500. The barrier tape 600 may serve to prevent a non-cured portion of the adhesive layer 230 from penetrating into the printed layer 410.

Hereinafter, an OLED display device 100 according to a third exemplary embodiment will be described with respect to with reference to FIG. 8. A description of a configuration in the third exemplary embodiment the same as that described in the first exemplary embodiment will be omitted herein for conciseness.

Figure 8:
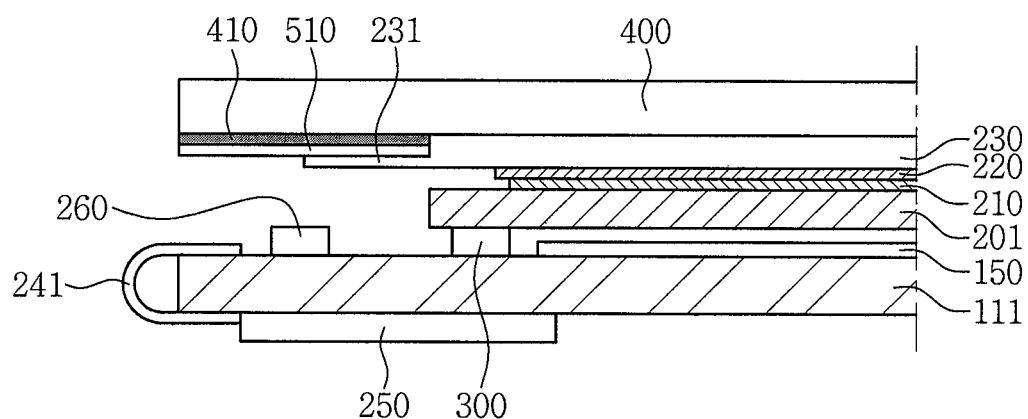
FIG. 8 is a cross-sectional view schematically illustrating an OLED display device according to a third exemplary embodiment.

FIG. 8 is a cross-sectional view schematically illustrating the OLED display device 100 according to the third exemplary embodiment.

Referring to FIG. 8, in the OLED display device 100 according to the third exemplary embodiment, a reflection layer 510 may be located on the printed layer 410. In other words, the reflection layer 510 may cover an upper surface of the printed layer 410. Accordingly, the reflection layer 510 may further enhance UV light reflectivity.

Hereinafter, an OLED display device 100 according to a fourth exemplary embodiment will be described with respect to with reference to FIG. 9. A description of a configuration in the fourth exemplary embodiment the same as that described in the first exemplary embodiment will be omitted herein for conciseness.

Figure 9:
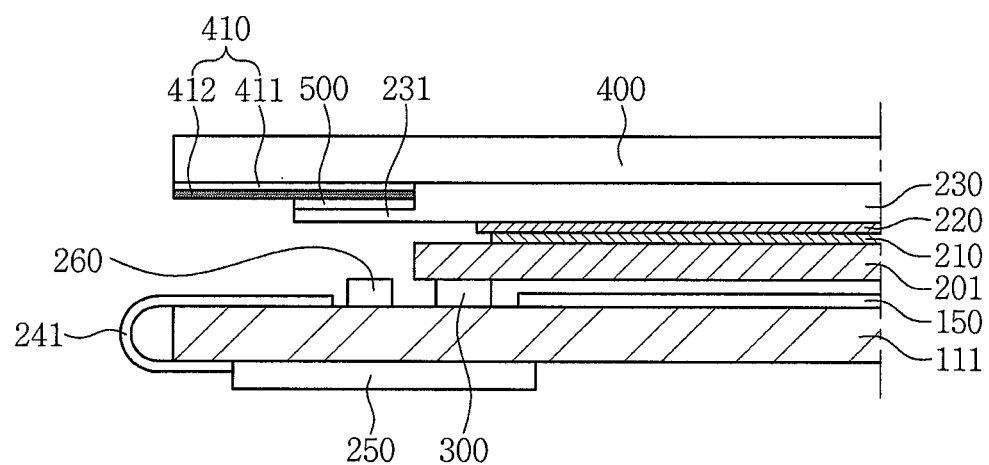
FIG. 9 is a cross-sectional view schematically illustrating an OLED display device according to a fourth exemplary embodiment.

FIG. 9 is a cross-sectional view schematically illustrating the OLED display device according to the fourth exemplary embodiment.

Referring to FIG. 9, in the OLED display device 100 according to the fourth exemplary embodiment, a printed layer 410 may include a design layer 411 and a light shielding layer 412.

The design layer 411 may include a pigment for representing various colors and textures in order to provide various design effects to an observer. For example, the design layer 411 may include a pearlescent pigment in order to provide a glittering visual effect to an observer. In addition, the design layer 411 may have a solid pattern, a character, or an image, and the like, in an opaque ink, for example, a black ink. In this case, the opaque ink may include a polyester ink having excellent bonding strength and high gloss subsequent to being dried.

The light shielding layer 412 may include a printing material for preventing a pattern disposed below the window 400 from being seen. The printing material may include a black printing material; however, the color of the printing material may vary based on a design of a desired device. The light shielding layer 412 may further include a photo-absorbent material such as Cr.

As set forth above, according to at least an exemplary embodiment, the OLED display device may prevent the non-cured state of the adhesive layer that overlaps the printed layer, and may prevent the discoloration of the printed layer and a peeling-off defect caused by the non-cured state of the adhesive layer.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
a display panel including a display area and a pad area;
a window located opposite to the display panel and covering the display area and the pad area;
a printed layer located on a portion of the window overlapping the pad area;
an adhesive layer located between the window and the display panel and covering at least a portion of an upper surface of the printed layer, the adhesive layer comprising a photo-curable resin; and
a reflection layer located between the printed layer and the adhesive layer, the reflection layer overlapping a portion of the printed layer so as to expose another portion of the printed layer toward the display panel.

2. The display device of claim 1, wherein the reflection layer includes at least one of a mirror silver ink, a pearlescent pigment, and an aluminum paste.

3. The display device of claim 1, further comprising a barrier tape located between the printed layer and the reflection layer.

4. The display device of claim 1, further comprising a flexible printed circuit board connected to the pad area to provide an electric signal to the display panel.

5. The display device of claim 4, wherein at least a portion of the flexible printed circuit board overlaps the printed layer and the adhesive layer.

6. The display device of claim 5, wherein at least a portion of the reflection layer overlaps the flexible printed circuit board.

7. The display device of claim 1, wherein the printed layer includes a design layer.

8. The display device of claim 7, wherein the printed layer includes a light shielding layer.

9. A display device comprising:
a display panel including a display area and a pad area;
a window disposed opposite to the display panel and covering the display area and the pad area;
a printed layer located on a portion of the window overlapping the pad area;
a reflection layer located on the printed layer, the reflection layer overlapping a portion of the printed layer so as to expose another portion of the printed layer toward the display panel; and
an adhesive layer located between the window and the display panel and covering at least a portion of an upper surface of the reflection layer, the adhesive layer comprising a photo-curable resin.

10. The display device of claim 9, wherein the reflection layer includes at least one of a mirror silver ink, a pearlescent pigment, and an aluminum paste.

11. The display device of claim 9, further comprising a barrier tape located between the printed layer and the reflection layer.

12. The display device of claim 9, further comprising a flexible printed circuit board connected to the pad area to provide an electric signal to the display panel.

13. The display device of claim 12, wherein at least a portion of the flexible printed circuit board overlaps the printed layer and the adhesive layer.

14. The display device of claim 13, wherein at least a portion of the reflection layer overlaps the flexible printed circuit board.

15. The display device of claim 9, wherein the printed layer includes a design layer.

16. The display device of claim 15, wherein the printed layer includes a light shielding layer.

* * * * *